United States Patent
Hsu

(10) Patent No.: US 9,716,016 B2
(45) Date of Patent: Jul. 25, 2017

(54) ELECTROSTATIC DISCHARGE (ESD) CLAMP

(71) Applicant: Taiwan Semiconductor Manufacturing Company Limited, Hsin-Chu (TW)

(72) Inventor: Chia-Wei Hsu, New Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 447 days.

(21) Appl. No.: 13/721,431

(22) Filed: Dec. 20, 2012

(65) Prior Publication Data
US 2014/0175611 A1   Jun. 26, 2014

(51) Int. Cl.
*H01L 23/60* (2006.01)
*H01L 21/48* (2006.01)
*H01L 27/02* (2006.01)

(52) U.S. Cl.
CPC ...... *H01L 21/4846* (2013.01); *H01L 27/0248* (2013.01)

(58) Field of Classification Search
CPC ............ H01L 29/0692; H01L 27/0255; H01L 29/1087; H01L 29/4238; H01L 27/0248
USPC ........ 257/124, 173, 121, 355, 360, 199, 362
See application file for complete search history.

(56) References Cited

U.S. PATENT DOCUMENTS

| | | | | |
|---|---|---|---|---|
| 5,272,371 A * | 12/1993 | Bishop | ................ | H01L 27/0251 257/361 |
| 5,637,900 A * | 6/1997 | Ker et al. | ....................... | 257/355 |
| 5,714,784 A * | 2/1998 | Ker et al. | ....................... | 257/360 |
| 5,852,315 A * | 12/1998 | Ker et al. | ....................... | 257/355 |
| 6,635,931 B1 * | 10/2003 | Wang | ............................ | 257/355 |
| 6,815,775 B2 * | 11/2004 | Ker et al. | ....................... | 257/355 |
| 6,960,792 B1 * | 11/2005 | Nguyen | ........................ | 257/173 |
| 7,629,210 B2 * | 12/2009 | Okushima | .................... | 438/199 |
| 7,633,139 B2 * | 12/2009 | Hiroshima | .......... | H01L 27/0783 257/557 |
| 8,648,386 B2 * | 2/2014 | Chen et al. | .................... | 257/173 |
| 8,796,729 B2 * | 8/2014 | Clarke et al. | ................. | 257/124 |
| 2013/0075809 A1 * | 3/2013 | Hsieh | ............................ | 257/328 |
| 2013/0264640 A1 * | 10/2013 | Salman | ............ | H01L 29/66659 257/343 |
| 2013/0328103 A1 * | 12/2013 | Salcedo | .............. | H01L 27/0262 257/121 |

* cited by examiner

*Primary Examiner* — Bradley K Smith
*Assistant Examiner* — David Goodwin
(74) *Attorney, Agent, or Firm* — Cooper Legal Group, LLC

(57) ABSTRACT

One or more techniques or systems for forming an electrostatic discharge (ESD) clamp are provided herein. In some embodiments, the ESD clamp includes a first pad and a second pad. For example, the first pad is a positive supply voltage (Vdd) pad and the second pad is a negative supply voltage (Vss) pad. In some embodiments, active regions and oxide regions are associated with substantially rounded shapes or obtuse angles. Additionally, metal regions are configured to be in contact with at least some of at least one of the active regions or the oxide regions and the first pad. In some embodiments, the metal regions are substantially wedge shaped. In this manner, an ESD clamp with enhanced performance is provided, at least because the respective active regions are substantially rounded or associated with obtuse angles, for example.

20 Claims, 3 Drawing Sheets

ELECTROSTATIC DISCHARGE (ESD) CLAMP

BACKGROUND

Generally, an electrostatic discharge (ESD) clamp provides an electrostatic discharge current path for an electrostatic discharge current associated with an ESD event. In this way, an ESD clamp mitigates ESD current from entering core circuitry associated with a device.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques or systems for forming an electrostatic discharge (ESD) clamp are provided herein. In some embodiments, the ESD clamp comprises a first pad and a second pad. For example, the first pad is a positive supply voltage (Vdd) pad and the second pad is a negative supply voltage (Vss) pad. In some embodiments, the ESD clamp comprises one or more second pads. In some embodiments, the ESD clamp comprises one or more active regions and one or more oxide regions. For example, an ESD clamp comprises a first active region and a second active region. Additionally, the ESD clamp comprises a first oxide region. In some embodiments, the one or more active regions and the one or more oxide regions are arranged in a concentric, alternating fashion. For example, the respective active regions and oxide regions are arranged similar to a bulls-eye on a target, according to some embodiments. In some embodiments, the first active region is encompassed by at least some of the first oxide region. In some embodiments, the first oxide region is encompassed by at least some of the second active region. Additionally, in other embodiments, the second active region is encompassed by at least some of a second oxide region, etc. In some embodiments, the ESD clamp comprises one or more metal regions. For example, the respective metal regions are associated with a wedge shape. In some embodiments, a metal region of the one or more metal regions is in contact with at least one of the first pad, the first active region, the first oxide region, the second active regions, or the second pad. In this way, ESD efficiency is enhanced, at least because the ESD clamp is associated with one or more second pads. Additionally, the ESD clamp is configured to endure high levels of ESD stress, at least because the active regions are at least one of substantially round or associated with obtuse angles, for example.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
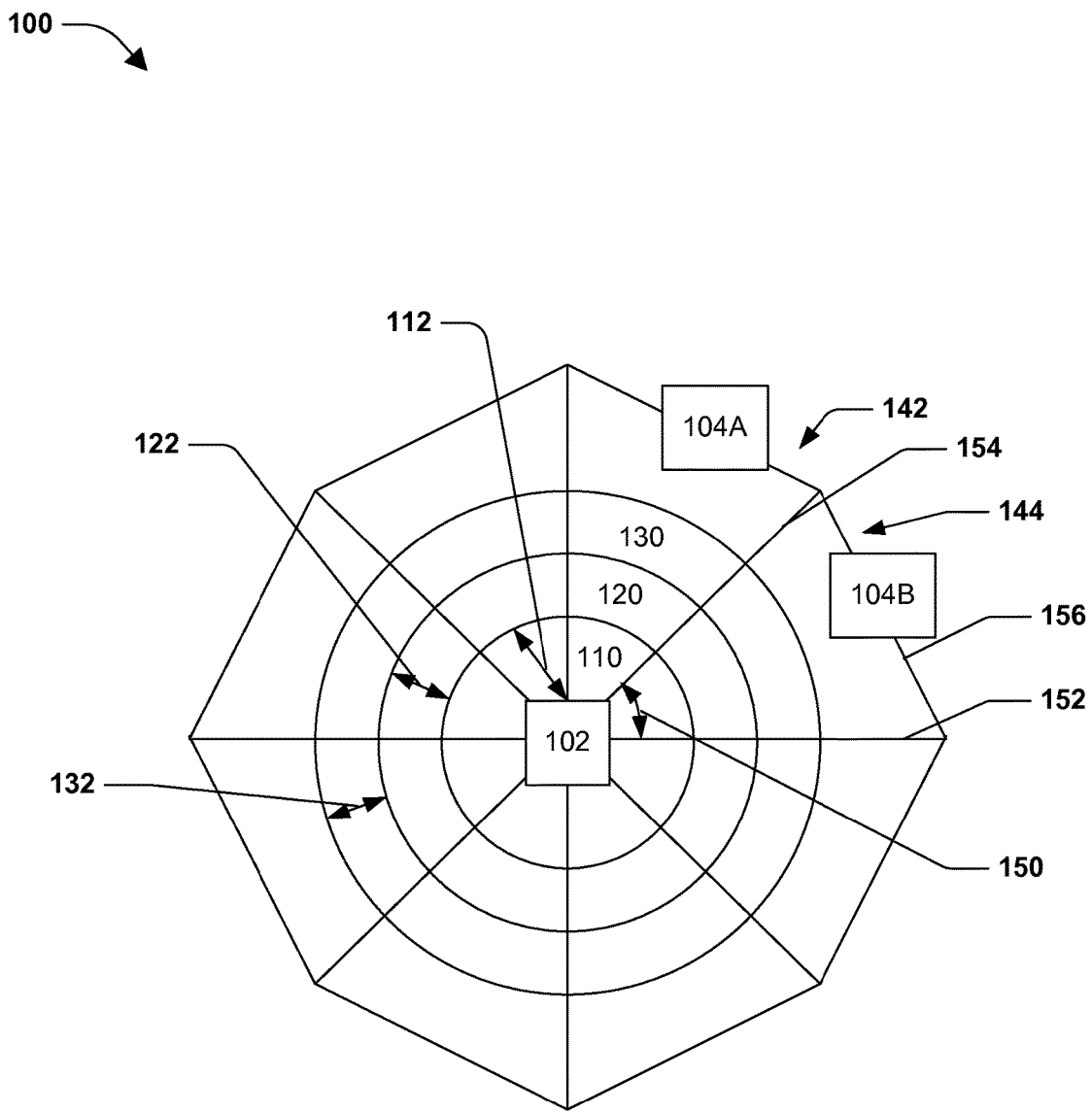
FIG. 1 is a layout view of an example electrostatic discharge (ESD) clamp, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 2:
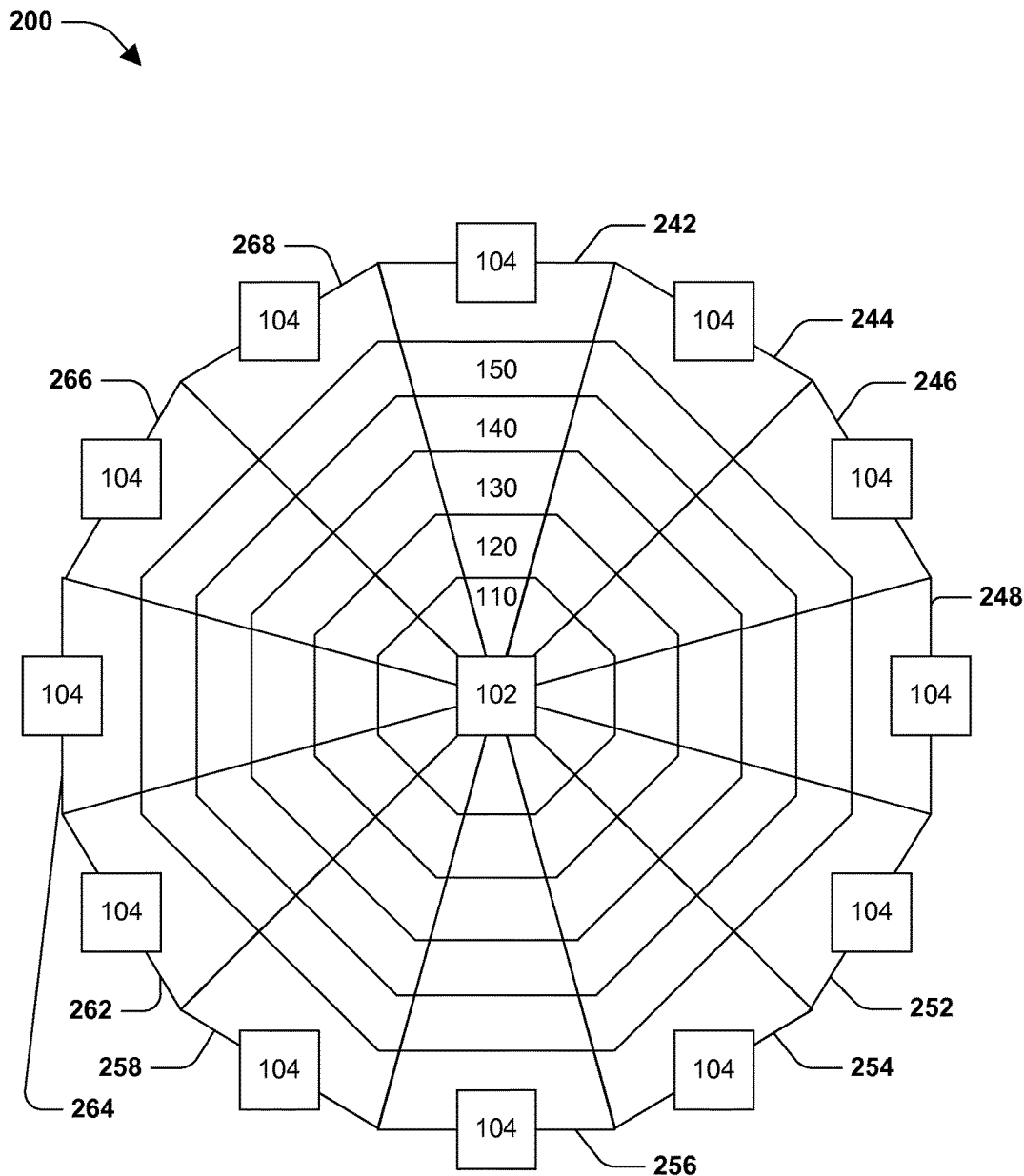
FIG. 2 is a layout view of an example electrostatic discharge (ESD) clamp, according to some embodiments.

It will be appreciated that for at least some of the figures herein, one or more boundaries or shapes, such as boundaries 110, 120, 130 of FIG. 1 or FIG. 2, for example, are drawn with different heights, widths, perimeters, aspect ratios, etc. relative to one another merely for illustrative purposes, and are not necessarily drawn to scale. For example, because a component is associated with an irregular shape, such as an octagon, for example, a shape, etc. does not necessarily encompass an entire component. Similarly, a shape does not necessarily encompass merely the associated component, but may encompass at least some of one or more other components as well, in some embodiments. Accordingly, dimensions of some of these boundaries are drawn taller, shorter, wider, narrower, etc. than needed in some embodiments so that the different boundaries are visible in the figures, for example.

FIG. 1 is a layout view 100 of an example electrostatic discharge (ESD) clamp, according to some embodiments. In some embodiments, the ESD clamp comprises one or more active regions. For example, the ESD clamp comprises a first active region 110 and a second active region 130. In some embodiments, the ESD clamp comprises one or more oxide regions. For example, the ESD clamp comprises a first oxide region 120. In some embodiments, the respective active regions and respective oxide regions are arranged in an alternating fashion concentrically, for example. Accordingly, the ESD clamp is associated with a concentric formation or configuration, for example. In some embodiments, the ESD clamp comprises a first pad 102 and one or more second pads 104A and 104B. In some embodiments, at least some of the one or more second pads are associated with a negative supply voltage (Vss). For example, at least some of the second pads are Vss pads. Accordingly, in some embodiments, at least one of second pad 104A or 104B is connected to Vss, for example. In some embodiments, the first pad 102 is associated with a positive supply voltage (Vdd). In some embodiments, the positive supply voltage is higher than the negative supply voltage. In some embodiments, the first pad 102 is a Vdd pad. In some embodiments, at least some of the one or more active regions comprise silicon. For example, at least one of the first active region 110 or the second active region 130 comprises silicon. In some embodiments, at least some of the one or more oxide regions comprises an insulator. For example, the first oxide region 120 comprises an insulator, such as oxide. In some embodiments, the ESD clamp comprises one or more metal regions. For example, the ESD clamp comprises a first metal region 142 of the one or more metal regions. For another example, the ESD clamp comprises a second metal region 144 of the one or more metal regions.

In some embodiments, at least some of the one or more metal regions is associated with at least one of a fan shape or a wedge shape. For example, a first metal region 142 of the one or more metal regions is associated with a triangular shape in some embodiments. In some embodiments, a wedge shape, such as the wedge shape of the second metal region 144, is associated with two or more edges and a rounded edge. For example, in some embodiments, the second metal region 144 is associated with two edges 152 and 154. Additionally, the second metal region 144 is associated with edge 156. In some embodiments edge 156 is at least one of an arc or rounded, for example. Accordingly, a metal region is associated with two edges and a rounded edge in some embodiments. In other words, when the wedge shape associated with an arc, the metal region is associated with a shape resembling a slice of pie. For example, the wedge is slice shaped, according to some embodiments. In some embodiments, a metal region of the one or more metal regions is associated with a fan shape. In some embodiments, the fan shape is associated with at least one of an acute angle or an obtuse angle. In some embodiments, at least some of the one or more metal regions is in contact with at least one of the first pad 102, the first active region 110, the first oxide region 120, the second active region 130, or one or more second pads, such as 104A or 104B. For example, a first metal region 142 of the one or more metal regions is in contact with at least one of the first pad 102, the first active region 110, the first oxide region 120, the second active region 130, or a second pad 104A. Similarly, a second metal region 144 of the one or more metal regions is in contact with at least one of the first pad 102, the first active region 110, the first oxide region 120, the second active region 130, or a second pad 104B. In some embodiments, at least some of the one or more metal regions are not in contact with at least some of the other metal regions. For example, the first metal region 142 is not in contact with the second metal region 144. For another example, at least one of the first metal region 142 or the second metal region 144 is not in contact with other metal regions. In this way, one or more current discharge paths to ground are provided, at least because the one or more metal regions are not in contact with at least some of the other metal regions. That is the first metal region 142 is a first current discharge path. For example, when an ESD event occurs, current travels from the first pad 102 to the first active region 110, the first oxide region 120, the second active region 130 to the second pad 104A via the first metal region 142. Similarly, the second metal region 144 is a second current discharge path. For example, when an ESD event occurs, current travels from the first pad 102 to the first active region 110, the first oxide region 120, the second active region 130 to the second pad 104B via the second metal region 144. In this way, respective metal regions provide one or more current discharge paths for current associated with an ESD event. In some embodiments, at least some of the one or more metal regions are associated with backend routing. For example, at least one of the first metal region 142 or the second metal region 144 is formed at a back end of the line.

In some embodiments, at least one of the first active region 110, the second active region 130, the first oxide region 120, one or more active regions, or one or more oxide regions is associated with a non-rectangular shape, for example. In some embodiments, at least one of the first active region 110, the second active region 130, the first oxide region 120, one or more active regions, or one or more oxide regions is associated with a substantially circular shape. In some embodiments, the circular shape is a donut shape. For example, at least one of the first active region 110, the second active region 130, the first oxide region 120, one or more active regions, one or more oxide regions, one or more additional active regions, or one or more additional oxide regions is associated with at least one of a convex shape, a simple shape, an equiangular shape, a cyclic shape, an equilateral shape, or a shape tangential to a circle, oval, etc., for example. In some embodiments, at least one of the first active region 110, the second active region 130, the first oxide region 120, one or more active regions, or one or more oxide regions is associated with a substantially rounded shape, such as an oval shape, for example. In other embodiments, at least one of the first active region 110, the second active region 130, the first oxide region 120, one or more active regions, or one or more oxide regions is associated with an irregular shape. For example, at least one of the active regions or oxide regions, such as 110, 130, or 120, are associated with obtuse angles. In some embodiments, at least one of the first active region 110, the second active region 130, the first oxide region 120, one or more active regions, or one or more oxide regions is associated with a shape that does not comprise an angle less than or equal to ninety degrees, as will be described in more detail in FIG. 2. In this way, a high level of ESD protection is provided, at least because the active regions, oxide regions, additional active regions, or additional oxide regions are not associated with acute angles, for example. Accordingly, the ESD clamp provides current uniformity, at least due to the one or more second pads or current paths associated with the one or more metal regions.

In some embodiments, at least some of at least one of the one or more active regions are concentric. In some embodiments, at least some of at least one of the one or more oxide regions are concentric. In some embodiments, at least some of at least one of the one or more active regions or the one or more oxide regions share a similar center, axis, or origin. In other words, the respective active regions and the respective oxide regions are concentric. In some embodiments at least some of the one or more active regions or at least some of the one or more oxide regions are arranged in an evenly spaced fashion. For example, a first active thickness 112 of the first active region 110 is substantially equal to a second active thickness 132 of the second active region 130. In some embodiments, a first oxide thickness 122 of the oxide region is substantially equal to a thickness of at least one of the active regions, such as the first active thickness 112 or the second active thickness 132. In this way, the respective active regions and oxide regions are at least one of concentric, evenly spaced, or associated with a bulls eye configuration, for example. It will be appreciated that in other embodiments, at least some of at least one of the one or more active regions or the one or more oxide regions does not share at least one of a same center, axis, or origin as at least one of the other active regions or at least one of the other oxide regions. In other words, at least some of at least one of the one or more active regions or one or more oxide regions are off-center with respect to the bulls eye configuration, for example. In some embodiments, at least one of the first active thickness 112, the second active thickness 132, or the first oxide thickness 122 is not equal to at least one of the first active thickness 112, the second active thickness 132, or the first oxide thickness 122. Accordingly, at least some of the ESD clamp is associated with an unevenly spaced configuration, for example. In some embodiments, the first active region 110 is associated with a first active dimension, such as a first active radius, for example. In some embodiments, the first oxide region 120 is associated with a first oxide dimension, such as a first oxide radius. For example, the first oxide radius is greater than the first active radius. In some embodiments, the second active region 130 is associated with a second active dimension, such as a second active radius. In some embodiments, the second active radius is greater than the first oxide radius. In some embodiments, a center of the ESD clamp is empty, for example.

In some embodiments, the ESD clamp comprises a number of active regions. For example, the number of active regions is based on a design parameter or an intended application for the ESD clamp. In some embodiments, the ESD clamp comprises a number of oxide regions. For example, the number of oxide regions is based on a design parameter or an intended application for the ESD clamp, such as an automotive application, etc. In some embodiments, the ESD clamp of FIG. 1 is associated with a Ferris wheel configuration, at least because at least some portions of the ESD clamp are substantially round, for example. Additionally, at least some of the metal regions are configured to discharge ESD current from the first pad 102 to at least some of the second pads. For example, one or more second pads are configured to surround at least some of the active regions or additional active regions.

Accordingly, FIG. 2 is a layout view 200 of an example electrostatic discharge (ESD) clamp, according to some embodiments. It will be appreciated that the ESD clamp of FIG. 2 is similar to the ESD clamp of FIG. 1, except that the ESD clamp of FIG. 2 is associated with a different number of active regions or oxide regions than the ESD clamp of FIG. 1, for example. Additionally, the ESD clamp of FIG. 2 is associated with a different number of second pads, for example. In some embodiments, at least some of the one or more active regions is associated with a polygon shape, for example. Additionally, at least some of the one or more oxide regions are associated with a polygon shape, for example. In some embodiments, the polygon shape is donut-like, for example. In this way, the ESD clamp is associated with a multi-ring configuration, for example. In some embodiments, the ESD clamp comprises a first pad 102 and one or more second pads 104. In some embodiments, the ESD clamp comprises one or more active regions. For example, the ESD clamp comprises a first active region 110, a second active region 130, and one or more additional active regions. In some embodiments, region 150 is a first additional active region. In some embodiments, the ESD clamp comprises a second additional active region (not shown), a third additional active region (not shown), etc. In some embodiments, the ESD clamp comprises one or more oxide regions. For example, the ESD clamp comprises a first oxide region 120. In some embodiments, the ESD clamp comprises one or more additional oxide regions. For example, region 140 is a first additional oxide region. In some embodiments, the ESD clamp comprises a second additional oxide region (not shown), a third additional oxide region (not shown), etc.

In some embodiments, the ESD clamp comprises one or more metal regions. For example, the ESD clamp comprises a first metal region 242, a second metal region 244, a third metal region 246, a fourth metal region 248, a fifth metal region 252, a sixth metal region 254, a seventh metal region 256, an eighth metal region 258, a ninth metal region 262, a tenth metal region 264, an eleventh metal region 266 and a twelfth metal region 268. In some embodiments, respective metal regions are connected to one or more second pads 104. In some embodiments, a metal region is in contact with at least one of the first pad 102, the first active region 110, the first oxide region 120, the second active region 130, the first additional oxide region 140, the first additional active region 150, or at least some of the second pads 104. In this way, ESD current associated with an ESD event travels along a current discharge path provided by the respective metal regions 242-268. In some embodiments, respective metal regions are not in contact with neighboring metal regions. For example, the second metal region 244 is not in contact with the first metal region 242. For another example, the second metal region 244 is not in contact with the third metal region 246.

In some embodiments, at least some of the active regions, oxide regions, additional oxide regions, or additional active regions are associated with a polygon associated with one or more obtuse angles. For example, the first active region 110 is associated with at least one of a first active substantially rounded shape. In some embodiments, the first oxide region 120 is associated with a first oxide substantially rounded shape. In some embodiments, the second active region 130 is associated with a second active substantially rounded shape. In some embodiments, the first additional oxide region 140 is associated with a first additional oxide substantially rounded shape. In some embodiments, the first additional active region 150 is associated with a first additional active substantially rounded shape. It will be appreciated that at least one of the first active substantially rounded shape, the first oxide substantially rounded shape, the second active substantially rounded shape, the first additional oxide substantially rounded shape, the first additional active substantially rounded shape, or any shape associated with at least one of the active regions, oxide regions, additional active regions, or additional oxide regions is a polygon according to some embodiments. In some embodiments, the polygon comprises a number of edges. For example, a shape associated with at least one of an active region, oxide region, additional active region, or additional oxide region is polygonal. In some embodiments, the respective metal regions are wedge shaped. In some embodiments, a first metal region 242 comprises an identical shape as a second metal region 244. In other embodiments, the first metal region 242 comprises a different shape than the second metal region 244.

In some embodiments, the first active substantially rounded shape is associated with merely obtuse angles, at least because the first active substantially rounded shape is tangential to at least one of a circle or an oval, for example. Similarly, the first oxide region 120 is associated with at least one of a first oxide substantially rounded shape. In some embodiments, the first oxide substantially rounded shape is associated with merely obtuse angles, at least because the first oxide substantially rounded shape is tangential to at least one of a circle or an oval, for example. In some embodiments, at least some of at least one of the one or more active regions, one or more oxide regions, one or more additional active regions, or one or more additional oxide regions is associated with at least one of a convex shape, a simple shape, an equiangular shape, a cyclic shape, an equilateral shape, or a shape tangential to a circle, oval, etc., for example.

Figure 3:
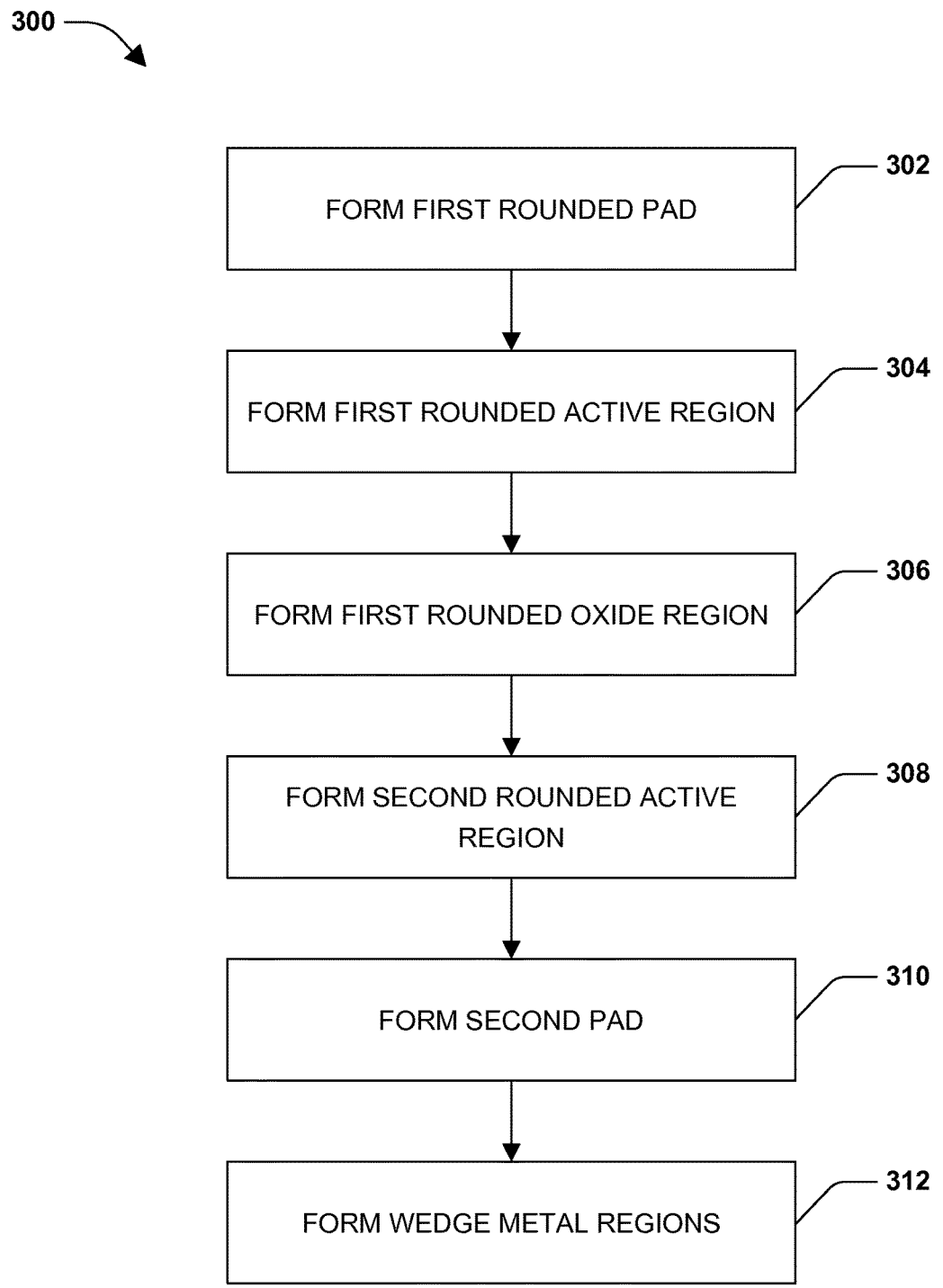
FIG. 3 is a flow diagram of an example method for forming an electrostatic discharge (ESD) clamp, according to some embodiments.

FIG. 3 is a flow diagram of an example method 300 for forming an electrostatic discharge (ESD) clamp, according to some embodiments. In some embodiments the method 300 comprises forming a first pad at 302. In some embodiments the method 300 comprises forming a first active region associated with a first active substantially rounded shape at 304. In some embodiments the method 300 comprises forming a first oxide region associated with a first oxide substantially rounded shape at 306. For example, the first oxide region encompasses at least some of the first active region. In some embodiments the method 300 comprises forming a second active region associated with a second active substantially rounded shape at 380. For example, the second active region encompasses at least some of the first oxide region. In some embodiments the method 300 comprises forming one or more second pads at 310. In some embodiments the method 300 comprises forming one or more metal regions associated with a substantially wedged shape at 312. For example, a metal region of the one or more metal regions is in contact with at least one of the first pad, the first active region, the first oxide region, the second active region, or at least some of the second pads.

According to some aspects, an electrostatic discharge (ESD) clamp is provided, comprising a first pad. In some embodiments, the ESD clamp comprises a first active region associated with a first active substantially rounded shape. In some embodiments, the ESD clamp comprises a first oxide region associated with a first oxide substantially rounded shape. For example, the first oxide region encompasses at least some of the first active region. In some embodiments, the ESD clamp comprises a second active region associated with a second active substantially rounded shape. For example, the second active region encompasses at least some of the first oxide region. In some embodiments, the ESD clamp comprises one or more second pads and one or more metal regions. In some embodiments, at least some of the one or more metal regions are associated with a substantially wedged shape. In some embodiments, a metal region of the one or more metal regions is in contact with at least one of the first pad, the first active region, the first oxide region, the second active region, or at least some of the second pads.

According to some aspects, an electrostatic discharge (ESD) clamp is provided, comprising a first pad. In some embodiments, the ESD clamp comprises a first active region associated with a first active substantially rounded shape and a first active dimension. In some embodiments, the ESD clamp comprises a first oxide region associated with a first oxide substantially rounded shape and a first oxide dimension. For example, the first oxide dimension is greater than the first active dimension. In some embodiments, the ESD clamp comprises a second active region associated with a second active substantially rounded shape and a second active dimension. For example, the second active dimension is greater than the first oxide dimension. In some embodiments, the ESD clamp comprises one or more second pads. In some embodiments, the ESD clamp comprises one or more metal regions associated with a wedge shape. For example, a metal region of the one or more metal regions is in contact with at least one of the first pad, the first active region, the first oxide region, the second active region, or at least some of the second pads.

According to some aspects, a method for forming an electrostatic discharge (ESD) clamp is provided, comprising forming a first pad. In some embodiments, the method comprises forming a first active region associated with a first active substantially rounded shape. In some embodiments, the method comprises forming a first oxide region associated with a first oxide substantially rounded shape. For example, the first oxide region encompasses at least some of the first active region. In some embodiments, the method comprises forming a second active region associated with a second active substantially rounded shape. For example, the second active region encompassing at least some of the first oxide region. In some embodiments, the method comprises forming one or more second pads. In some embodiments, the method comprises forming one or more metal regions associated with a substantially wedged shape. For example, a metal region of the one or more metal regions is in contact with at least one of the first pad, the first active region, the first oxide region, the second active region, or at least some of the second pads.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first pad, second pad(s), first active region, second active region, third active region, first oxide region, second oxide region, third oxide region, one or more metal regions, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An electrostatic discharge (ESD) clamp, comprising:
a first pad;
a first active region electrically coupled to the first pad and associated with a first active substantially rounded shape;
a first oxide region associated with a first oxide substantially rounded shape, the first oxide region encompassing at least some of the first active region;
a second active region associated with a second active substantially rounded shape, the second active region encompassing at least some of the first oxide region;
a second oxide region associated with a second oxide substantially rounded shape, the second oxide region encompassing at least some of the second active region;
a third active region associated with a third active substantially rounded shape, the third active region encompassing at least some of the second oxide region, wherein the second active region is between the first active region and the third active region;
a second pad electrically coupled to a first portion of the third active region;
a third pad electrically coupled to a second portion of the third active region; and
a metal layer divided into a plurality of wedges, the second pad electrically coupled to a first wedge of the plurality of wedges and the third pad electrically coupled to a second wedge of the plurality of wedges, wherein the first wedge is adjacent the second wedge and not in contact with the second wedge.

2. The ESD clamp of claim 1, wherein the first wedge provides a first current discharge path and the second wedge provides a second current discharge path different than the first current discharge path.

3. The ESD clamp of claim 1, the first active region associated with a first active thickness.

4. The ESD clamp of claim 1, the first oxide region associated with a first oxide thickness.

5. The ESD clamp of claim 1, the second active region associated with a second active thickness.

6. The ESD clamp of claim 1, the second active region in contact with the first oxide region and the second oxide region.

7. The ESD clamp of claim 1, comprising one or more additional oxide regions associated with a substantially rounded shape.

8. The ESD clamp of claim 1, comprising a number of active regions based on a design parameter.

9. The ESD clamp of claim 1, comprising a number of oxide regions based on a design parameter.

10. The ESD clamp of claim 1, the second pad and the third pad associated with a negative supply voltage (Vss).

11. The ESD clamp of claim 1, comprising:
a first substantially wedged shape metal region electrically coupled to the second pad; and
a second substantially wedged shaped metal region electrically coupled to the third pad.

12. The ESD clamp of claim 1, the first active region comprising silicon.

13. The ESD clamp of claim 1, the second active region comprising silicon.

14. The ESD clamp of claim 1, the first active region forming a first closed loop, the second active region forming a second closed loop, and the third active region forming a third closed loop.

15. An electrostatic discharge (ESD) clamp, comprising:
a first pad;
a first active region electrically coupled to the first pad;
a first oxide region encompassing the first active region;
a second active region encompassing the first oxide region;
a second pad electrically coupled to a first portion of the second active region;
a third pad electrically coupled to a second portion of the second active region, the second pad different than the third pad; and
a metal layer over the second active region and divided into a plurality of wedges, a first wedge of the plurality of wedges electrically coupled to the second pad and the first portion of the second active region and a second wedge of the plurality of wedges electrically coupled to the third pad and the second portion of the second active region, wherein the first wedge is adjacent the second wedge and not in contact with the second wedge to provide distinct current discharge paths.

16. The ESD clamp of claim 15, comprising a third active region encompassing the second active region, the first wedge electrically coupled to a first portion of the third active region.

17. The ESD clamp of claim 15, the first pad associated with a positive supply voltage (Vdd).

18. The ESD clamp of claim 15, the second pad and the third pad associated with a negative supply voltage (Vss).

19. The ESD clamp of claim 15, at least some of at least one of the first active region, the first oxide region, or the second active region arranged in concentric formation.

20. A method for forming an electrostatic discharge (ESD) clamp, comprising:
forming a first pad;
forming a first active region associated with a first active substantially rounded shape;
forming a first oxide region associated with a first oxide substantially rounded shape, the first oxide region encompassing at least some of the first active region;
forming a second active region associated with a second active substantially rounded shape, the second active region encompassing at least some of the first oxide region;
forming a first wedge-shaped metal region, the first wedge-shaped metal region electrically coupled to a first portion of the second active region;
forming a second wedge-shaped metal region adjacent the first wedge-shaped metal region, the second wedge-shaped metal region electrically coupled to a second portion of the second active region and not in contact with the first wedge-shaped metal region;
electrically coupling a second pad to the first wedge-shaped metal region; and
electrically coupling a third pad to the second wedge-shaped metal region, the first wedge-shaped metal region providing a first current path and the second wedge-shaped metal region providing a second current path different than the first current path.

* * * * *